United States Patent [19]

Miles et al.

[11] Patent Number: 4,928,062

[45] Date of Patent: May 22, 1990

[54] LOADING AND ACCURATE MEASUREMENT OF INTEGRATED DYNAMIC PARAMETERS AT POINT OF CONTACT IN AUTOMATIC DEVICE HANDLERS

[75] Inventors: Philip D. Miles, Lavendon, England; John R. Moody, Jr., Sherman; Sheila O'Keefe, Garland, both of Tex.

[73] Assignee: Texas Instruments Incorporated, Dallas, Tex.

[21] Appl. No.: 368,157

[22] Filed: Jun. 14, 1989

Related U.S. Application Data

[63] Continuation of Ser. No. 146,058, Jan. 20, 1988, abandoned.

[51] Int. Cl.$^5$ .................. G01R 1/02; G01R 1/067
[52] U.S. Cl. .................. 324/158 R; 324/158 F; 324/636
[58] Field of Search ............ 324/158 P, 158 F, 158 R, 324/73 R, 57 R, 58.5 B, 58 R, 58 A, 58 B

[56] References Cited

U.S. PATENT DOCUMENTS

| | | | |
|---|---|---|---|
| 3,508,156 | 4/1970 | Webb | 324/58 R |
| 3,525,937 | 8/1970 | Mozer | 324/58 A |
| 4,047,780 | 9/1977 | Cedrone | 324/158 F |
| 4,495,458 | 1/1985 | Murphy | 324/58 B |
| 4,523,312 | 1/1985 | Takeuchi | 324/73 R |
| 4,556,841 | 12/1985 | Carlson | 324/57 R |
| 4,574,235 | 3/1986 | Kelly et al. | 324/158 P |
| 4,583,223 | 4/1986 | Inoue et al. | 324/73 R |
| 4,639,664 | 1/1987 | Chiu et al. | 324/73 R |
| 4,646,299 | 2/1987 | Schinabeck et al. | 324/73 R |
| 4,651,088 | 3/1987 | Sawada | 324/73 R |
| 4,680,538 | 7/1987 | Dalman et al. | 324/58 B |
| 4,689,556 | 8/1987 | Cedrone | 324/158 F |
| 4,707,657 | 11/1987 | Boegh-Petersen | 324/158 P |
| 4,801,871 | 1/1989 | Tada et al. | 324/73 PC |

FOREIGN PATENT DOCUMENTS 2176063  12/1986  United Kingdom ............ 324/158 F Primary Examiner—Reinhard J. Eisenzopf
Assistant Examiner—W. Burns
Attorney, Agent, or Firm—Gary C. Honeycutt; Melvin Sharp; Rhys Merrett

[57] ABSTRACT

An interconnection device is disclosed that is connected between a semiconductor device to be tested and the tester to match the device output impedance with the load applied to the semiconductor device and to prevent reflection on input waveforms in propagation delay measurements.

18 Claims, 3 Drawing Sheets

LOADING AND ACCURATE MEASUREMENT OF INTEGRATED DYNAMIC PARAMETERS AT POINT OF CONTACT IN AUTOMATIC DEVICE HANDLERS

This application is a Continuation, of application Ser. No. 07/146,058, filed Jan. 20, 1988 now abandoned.

FIELD OF THE INVENTION

This invention relates to testing of integrated circuits and more particularly to accurate measurement of dynamic parameters of integrated circuits while the integrated circuit is being handled by an automatic test handler.

DISCUSSION OF THE PRIOR ART

One of the most critical requirements of automated integrated circuit testers today is the ability to make extremely accurate time measurements on the DUT (Device Under Test). The increasing speed of DUTs and the growing emphasis on quality require tighter timing accuracy on each new generation of tester, causing previously insignificant sources of timing errors to become intolerable.

Four errors or test factors/conditions that need improvement and that are significant are: (1) incorrect load seen by the DUT at time of transition; (2) reflection on input waveform in propagation delay measurements; (3) single drive/receive path; and (4) contactor electrical length.

Attempts have been made to correct these test factors. Minimizing signal distortion requires a carefully controlled impedance on the path from the tester to the DUT, normally 50 ohms. For the electrical length of the path to the tester the DUT sees this 50 ohm load. Most DUTs are not, however, designed to drive a 50 ohm load, causing the DUT to have to drive a load different from that called for in the data sheet for a short period of time.

The specified load is normally placed on the load board approximately 5 inches from the contactor. Adding 2.5 inches length for the contactor, the DUT must drive approximately 7.5 inches and get a reflection back before it sees its desired load. Using a nominal signal velocity of 1.8 ns per foot, the device will not see its desired load for 2.25 ns.

This 2.25 ns delay has been insignificant with slower devices, but with AS (Advanced Schottky) devices having propagation delays in the order of 5 ns, 2.25 ns becomes very important, causing DUTs timing parameters to be measured under different conditions then specified.

Most testers either ignore the problem of incorrect load seen by the DUT at time of transition, or use a golden unit to compensate for the error. The 'Golden Unit' concept uses a reference device of the same type as the DUT. Accurate timing parameter measurements are made on the reference device in a bench setup. The same timing parameter measurements are then made on the referenced device with the tester. The difference between the bench measurements and the tester measurements are stored in the tester memory and applied by the software to all DUT measurements as an offset correction factor.

While the Golden Unit approach achieves adequate accuracy, it has several drawbacks.

First, if a large number of device types are to be tested, an equally large number of reference devices must be kept. Adequate storage space must be allocated together with sufficient manpower to keep track of the devices and their corresponding bench measurements.

Second, making the accurate bench measurements is extremely time consuming.

Third, there is a chance of operator error while the bench measurements are being made. This could lead to invalid test results for all DUTs of a given device type with the attendant damage to the IC manufacturer's reputation.

Fourth, it is impossible to assure identical test environments on the bench and the tester. In particular, a change in ambient temperature may cause a slight change in the reference device's timing characteristic, leading to inaccuracies in test results.

Fifth, tester calibration cannot be entirely automatic when using the golden unit. Making the measurements of the golden unit on the tester requires human intervention and therefore the time interval between tester calibrations cannot be guaranteed.

Finally, incorrect loading introduces an error to the Golden Unit method. The drive capability of devices varies from device to device of the same type. The difference in load which causes a timing error on the reference device may cause a different timing error on another DUT.

The second error is reflections on the input waveform in propagation delay measurements. Propagation delays of logic devices are usually measured with the input pin connected to the TMU (Timing Measurement Unit) start channel and the output pin connected to the TMU stop channel.

Any reflections on either the input signal or the output signal can lead to errors in the time measurement. Because the receiver sense line is normally located in the tester, most testers have a reflection on the input signal equal to twice the path length from the receiver sense point to the DUT. This path is approximately 8.5 inches long. Using 1.8 ns per foot signal velocity, this path gives a reflection of 2.55 ns.

On most testers, this problem is solved by setting the receiver trip point below the region of the waveform midpoint. Device propagation delays are generally specified from threshold voltage on the input waveform to threshold voltage on the output waveform. For TTL devices, the threshold voltage is nominally 1.3 volts, too close to the waveform midpoint of 1.5 volts to guarantee no error.

Most testers have a single path from the pin electronics driver and/or receiver to the DUT pin. The electrical lengths of this path introduces a timing error. This path is normally in the order of 6 inches. Again, using 1.8 ns per foot signal velocity, this path will contribute a round-trip error of 1.8 ns. All delay measurements will be 1.8 ns greater than the actual DUT delay unless this error is somehow removed.

Testers presently on the market take one of two approaches to this problem. The first is the 'Golden Unit' approach discussed above. The second is to make a driver to receive loop-back measurement and then to add an offset equal to the round trip length of the DUT to tester path. The path length is determined through TDR (Time Domain Reflectometry).

While the TDR method is adequate in some circumstances, it involves some loss of accuracy because multiple measurements must be made (loop-back measurement and 2 points on the TDR waveform). Each measurement adds another element of inaccuracy, plus any discontinuities in impedance of the tester to DUT path will further contribute to TDR measurement inaccuracy.

Contactor electrical length is another factor that has to be considered. Most automatic DUT handlers contain a contactor assembly which connects the tester to the DUT. This contactor is not normally attached to the tester at calibration time. Thus, the contactor signal paths introduce timing errors which are not compensated in system calibration.

The physical length of the contactor is approximately 2.5 inches, giving a signal round-trip path of 5 inches. With the signal velocity of 1.8 ns per foot, this gives an electrical length of 750 ps. All delay measurements on the DUT will be 750 ps greater than the actual DUT delay unless this error is removed.

Traditionally contactor electrical length has been small enough to ignore. Most testers still ignore this length at calibration time. These testers then compensate for it with a 'Golden Unit'.

DESCRIPTION OF THE INVENTION

The invention is to the design of an automatic test system that will allow for accurate timing measurements and for proper loading of the output of devices under test that are specified to drive 50 ohm transmission lines.

Two lines are used from the tester to the device under test. A relay is used to switch from the driver to a capacitive load. The resistance of the transmission line is in series with a chip resistor and provides the resistive portion of the specified load.

The characteristic impedance of the transmission line is matched with a resistor, i.e. the transmission lines is terminated with its characteristic impedance so no reflections occur back toward the device output. Different values of transmission line impedance may be used.

The device under test will see a load based upon how far a resistive load is from the device output pin. By using small chip resistors the resistor can be placed very close to the DUT output chip.

Propagation delay measurements are made using an AC sense line on the device input. A similar circuit on the output of the device provides the device resistive load and signal to the tester stop input on a time measurement unit. Start/stop signals are sensed close to the device pins and therefore delay through the device is accurately measured. The sense line on the input pin does load the driver input signal, but this is compensated by driving a slightly higher signal level from the driver.

Other circuits are used to make DC measurements. The DC measurement system is connected to the AC sense lead. The resistive loading on the sense lead has no effect on the DC measurement because no current flows in the sense lead.

Pin diodes are used for switching in a load capacitor. This solves the problem of getting the load capacitor close to the device under test, both in a hand test situation and when automatic device handlers are used.

A multilayer flex printed circuit is used to control impedances, and provide a close connection of the load board to contact fingers. The flex circuit is 'nailed' to the load board to eliminate edge connectors which may present discontinuity to high frequency signals.

The device under test is moved along a rail or track so that the pins on the device contact fingers on one end of the flex circuit. The device is then moved along the track to permit testing of another device. The track may bring devices from a manufacturing line or other testing operation, and may generally be one step in the manufacturing/testing process of semiconductor devices.

The technical advance represented by the invention as well as the objects thereof will become apparent from the following description of a preferred embodiment of the invention when considered in conjunction with the accompanying drawings, and the novel features set forth in the appended claims.

DESCRIPTION OF A PREFERRED EMBODIMENT

Figure 1:
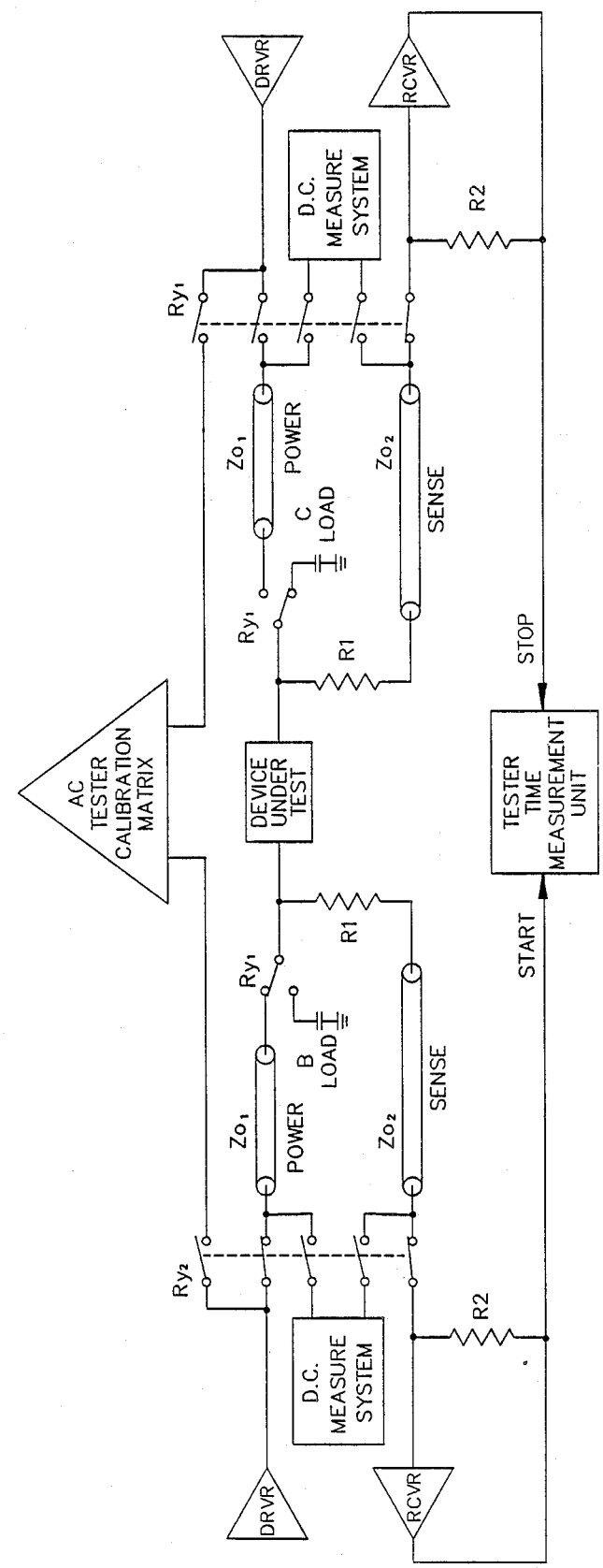
FIG. 1 is a diagram of the concept of the present invention.

FIG. 1 illustrates a diagram of one embodiment of the tester of the present invention. This embodiment is to an automatic test system that will allow for accurate timing measurements and for proper loading of the output of devices that are not necessarily specified to drive 50 ohm transmission lines.

Two lines, Z01 and Z02, are used from the tester to the device under test. A relay Ry1 is used to switch from the driver to a capacitive load. Resistor R2 represents the resistance of the sense transmission line, and resistor R1 provides the resistive portion of the specified load.

The value of R2 is made to match the characteristic impedance Z02 of the sense transmission line. Since the line is terminated in its characteristic impedance, no reflection occurs back toward the device output. Resistor R1 is selected in combination with the characteristic impedance Z02 of the sense transmission line to provide the specified resistive device loading. Various combinations of R1, Z02 and R2 may be used to obtain resistive loading in the range of 100 ohms to 1000 ohms.

In the case of ASTTL devices, the specified load is 500 ohms and 50 PF. For this type of device, a 50 PF capacitor is connected to the delay. The capacitance may be somewhat less to compensate for stray capacitance. Resistor R1 is made 450 ohms and a 50 ohm Z01 sense transmission line is used with a 50 ohm R2.

The output signal is attenuated by the R1/sense transmission line Z02/R2 combination by a factor of about 10. However, it is an undistorted representation of the output signal. The attenuation can be modified by using different values of transmission line impedance. For example, using R1=400 ohms, Z02=100 ohms, and R2=100 ohms, an attenuation factor of 5× results.

The output of the device under test will 'see' the 500 ohm load based on the distance the resistor R1 is from the device output pin. By using small chip resistors, the resistor can usually be placed very close to the DUT output pin. The device does not have to wait for a reflection back from the tester load circuit.

Propagation delay measurement can be made using the AC sense line on the device input signal line as the start input to the test time measurement unit. The similar circuit on the output of the device provides the device resistive load and signal to the tester stop input on the time measurement unit. The start/stop signals are sensed close to the device pins and therefore the delay through the device is accurately measured. The sense line on the input pin does load the driver input signal, but this can be compensated by driving a slightly higher signal level from the driver.

Typical automatic test systems have other circuits that are used to make DC measurements on device input/output pins. These are typically connected through relays to the drive and receive lines to the device pins. The DC power lead Z01 supplies any current to the device and the sense lead Z02 is used to sense the DC voltage at the device pin. The sense lead normally draws no current, or at most a very low current.

The DC measurement system can be connected to the AC power and sense lead with relays Ry1 and Ry2. The resistor R1 in the sense lead Z02 has not effect on the DC measurement due to the fact that no current flows in the sense lead. Therefore, the AC sense mechanism is compatible with the DC measurement unit.

The above solves the problem of placing the resistive load close to the DUT, and measuring the DUT output, but there may be some distortion of the waveform due to the distance the capacitive load circuit is from the DUT. Traditionally this load is switched into the circuit on an output pin by a relay Ry1.

Figure 2:
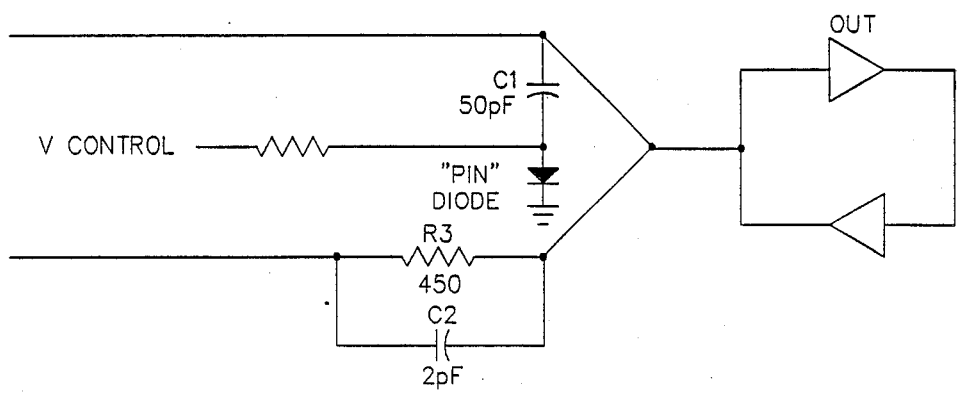
FIG. 2 illustrates the use of a pin diode in the present invention.

If the inherent characteristics of a pin diode are used, a low impedance to RF signals when forward biased, the requirement for a relay, such as Ry1, to switch in the load capacitor can be eliminated. A pin diode is used instead. In FIG. 2 a circuit using a pin diode is illustrated. With the diode forward biased, the capacitor C1 is 'seen' by the DUT, and since both these components are available in surface mount packages, they can be placed physically and electrically close to the device under test. The use of the pin diode for switching in the load capacitor C1 solves the problem of getting the load capacitor close to the device, both in hand test situations, and when an automatic device handler is used.

The contents to the DUT are generally screened, low capacitive, and in some instances have a characteristic impedance of 50 ohms to match tester signal lines. In the typical case the load circuit for the DUT is some distance from the device pin. The invention has overcome this problem with a multilayer flexible circuit. With the flexible circuit, the impedances are controlled up to the contact fingers.

Figure 4:
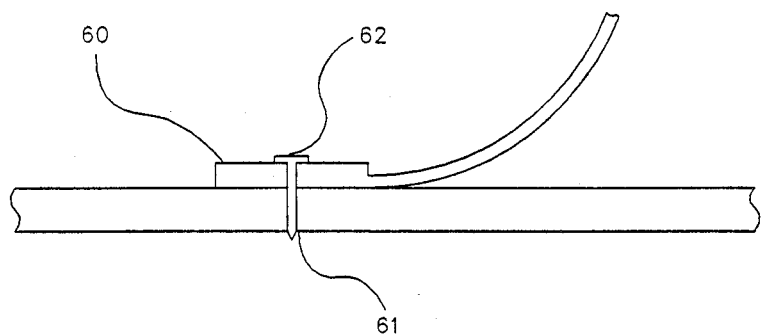
FIG. 4 illustrates the use of a 'nail' to connect the flex circuit to test load board.

The flexible circuit is 'nailed' to the load board. See FIG. 4. The 'nailed' connection eliminates edge type connectors which generally present a large discontinuity to high frequency test signals. With the use of the 'nailed' contact, the discontinuity seen by the signals is not more than on a normal printed circuit board, and the screened 50 ohm impedance can be maintained up to the contact fingers contacting the DUT.

Figure 3:
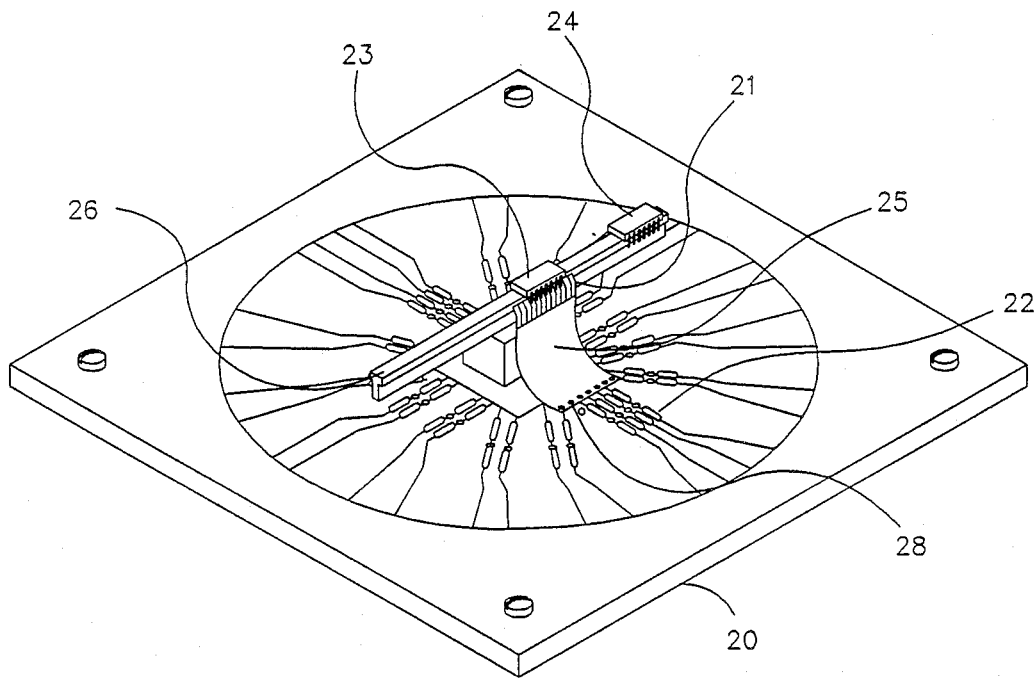
FIG. 3 illustrates a load board and flex circuit interconnection.

FIG. 3 illustrates conceptually an embodiment of the invention. A load board 20 has load circuitry generally indicated at 22 on the board. Load board 20 is a printed circuit board having the load and testing circuits thereon, and is connected to the test computer (not illustrated).

A track 26 spans the load board 20 and provides a means for moving the DUT into contact with the test circuit. The load board is connected to flex circuit 25, and attached thereto with the 'nails' 28. Flex circuit 25 has contact fingers 21 on the end opposite the nail contacts which are positioned adjacent the track 26 so that when a device 23 is moved along the track 26, the device pins will contact the contact fingers 21. A device 24 is queued behind device 23 and will be tested upon completion of the testing of device 23.

Figure 5:
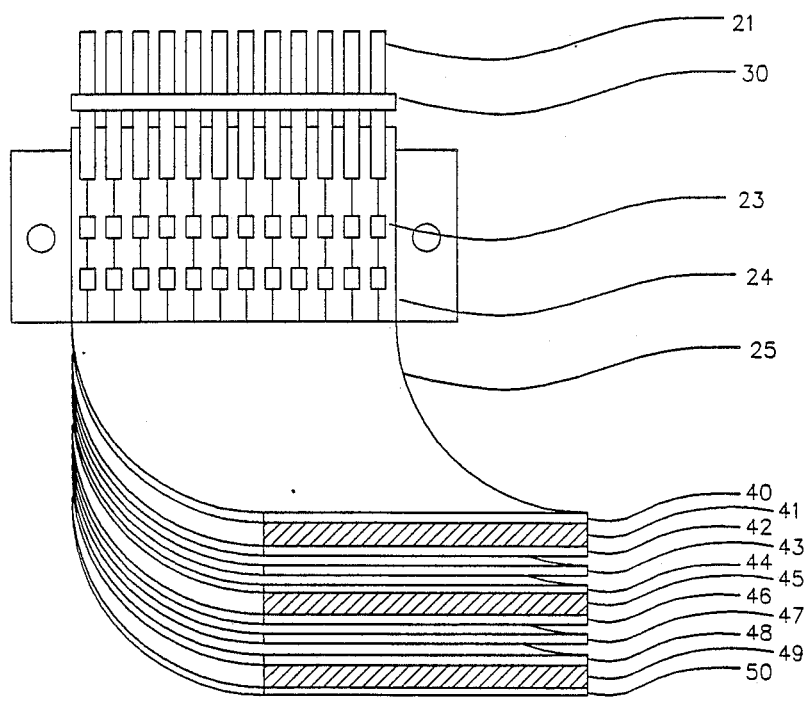
FIG. 5 illustrates the flex circuit of the present invention.

The flex circuit 25 is illustrated in more detail in FIG. 5. A semirigid printed circuit board 34 is incorporated in one end of the flex circuit. This semirigid circuit board is used to mount the flex circuit to structure below the track 26, and to provide support for the contact fingers 21. The contact fingers 21 are also supported and maintained a fixed distance apart by molded support 30.

Small components such as pin diodes and chip resistors are mounted at 33. This permits mounting vital components close to the DUT to reflect proper impedances and capacitive loading. Control signals are sent to and received from the DUT via flex circuit multilayers, which layers form transmission lines and conductors to and from the DUT.

The layers of the flex circuit are illustrated in FIG. 5. The layers are 40, the component side, a base insulated layer 41, ground plane layer 42, an insulated layer 43, signal layer 44, another base insulated layer 45, and second ground plane layer 46, an insulated layer 47, a second signal layer 48, a third base layer 49 and a solder side 50. The two signal layers 44 and 48 in conjunction with the ground plane layers and other layers form transmission lines connected to the DUT, via the small components, to the load board, and to present the proper impedances between device and load, or other test/signal circuits.

By using the combination of a controlled impedance multilayer printed circuit, surface mount components, and pin diodes, the device can be loaded, both resistive and capacitive, at the point of contact, and make accurate measurements of the device dynamic parameters while using an automatic device handler to present, and connect the device to the automatic tester.

What is claimed:

1. In a test system for making accurate measurements of semiconductor devices under test, a connect device comprising:
    (a) a controlled impedance multilayer printed circuit defining transmission lines and ground planes,
    (b) electrical components mounted on said multilayer printed circuit,
    (c) spatially fixed contact fingers secured to said electrical components for contacting said semiconductor devices under test,
    (d) two lines from the test system to a device under test, one line being a power line from a driver circuit and the other line being a sense line to a receiver circuit, and
    (e) said electrical components including means for selectively and reversibly switching in and connecting the semiconductor devices to load devices.

2. The connect device according to claim 1, wherein said load device is at least one of resistive or capacitive.

3. The connect device according to claim 1, further including a load board and said load devices secured to said load board, said multilayer printed circuit being secured to said load board at locations thereon spaced from said contact fingers to make contact therewith.

4. The connect device according to claim 1, wherein said multilayer printed circuit includes two transmission lines and two ground planes.

5. In a test system for making accurate measurements of semiconductor devices, a connect device comprising:
   (a) a controlled impedance multilayer printed circuit defining transmission line means and ground plane means,
   (b) electrical components mounted on said multilayer printed circuit,
   (c) spatially fixed contact fingers secured to said surface mount components for contacting said semiconductor devices,
   (d) said surface mount components including means for switching in and connecting the semiconductor devices to load devices,
   (e) said multilayer printed circuit including two transmission lines and two ground planes,
   (f) further including two lines from the test system to a device under test, one line being a power line including a driver circuit and one of said transmission lines and the other line being a sense line including a receiver and the other of said transmission lines, and
   (g) a relay to switch from the driver circuit to a capacitive load.

6. The connect device according to claim 1, wherein said sense line has a predetermined characteristic impedance, further including a resistor coupled to said sense line to provide resistive device loading of the device under test.

7. The connect device according to claim 6, wherein said resistor is a chip resistor and is placed adjacent to the output pin of the device under test.

8. The connect device according to claim 5, wherein said relay is one of said components in the form of a pin diode to switch from said driver circuit to said capacitive load.

9. In a test system for making accurate measurements of semiconductor devices, the combination of:
   (a) a test system,
   (b) a device track for moving a device to be tested into and out of contact with said test system, and
   (c) a connect device for connecting the device to be tested with said test system, said connect device comprising:
   (d) a controlled impedance multilayer printed circuit defining transmission line means and ground plane means,
   (e) electrical components mounted on said multilayer printed circuit, and
   (f) spatially fixed contact fingers secured to said surface mount components and said device track for contacting said semiconductor devices,
   (g) said surface mount components including means for switching in and connecting the semiconductor devices to at least one load device.

10. The combination according to claim 9, wherein said contact fingers are brought into sliding engagement with a device to be tested as said device to be tested is moved along said device track.

11. The connect device according to claim 9, wherein said load device is at least one of resistive or capacitive.

12. The connect device according to claim 9, wherein said multilayer printed circuit is a flex printed circuit.

13. The connect device according to claim 11, including contact fingers connected to one end of the multilayer flex circuit for contacting the semiconductor device.

14. The contact device according to claim 9, further including a load board and said load devices secured to said load board, said multilayer printed circuit being secured to said load board at locations thereon spaced from said contact fingers to make contact therewith.

15. The connect device according to claim 9, wherein said multilayer printed circuit includes two transmission lines and two ground planes.

16. The connect device according to claim 9, including two lines from the test system to a device under test, one line being a power line including a driver circuit and one of said transmission lines and the other line being a sense line including a receiver and the other of said transmission lines.

17. The connect device according to claim 16, further including a capacitive load and a relay in the form of a pin diode forming one of said components to switch from said driver circuit to said capacitive load.

18. The connect device according to claim 16, wherein said sense line has a predetermined characteristic impedance, further including a resistor coupled to said sense line to provide resistive device loading of the device under test.

* * * * *